(12) United States Patent
Voutsas

(10) Patent No.: US 9,299,725 B2
(45) Date of Patent: Mar. 29, 2016

(54) FABRICATION PROCESS USING CIRCUIT-ON-WIRE

(71) Applicant: Sharp Laboratories of America, Inc., Camas, WA (US)

(72) Inventor: Apostolos Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 144 days.

(21) Appl. No.: 14/256,093

(22) Filed: Apr. 18, 2014

(65) Prior Publication Data

US 2015/0221671 A1    Aug. 6, 2015

Related U.S. Application Data

(63) Continuation-in-part of application No. 14/169,202, filed on Jan. 31, 2014.

(51) Int. Cl.
*H01L 27/14* (2006.01)
*H01L 27/12* (2006.01)
*H01L 25/075* (2006.01)

(52) U.S. Cl.
CPC .......... *H01L 27/124* (2013.01); *H01L 27/1259* (2013.01); *H01L 25/0753* (2013.01)

(58) Field of Classification Search
CPC .......................... H01L 27/124; H01L 27/1259
USPC .......................................................... 257/72
See application file for complete search history.

(56) References Cited

U.S. PATENT DOCUMENTS

| 6,900,854 | B1* | 5/2005 | Kim | G02F 1/134336 257/E29.068 |
|---|---|---|---|---|
| 6,911,666 | B2 | 6/2005 | Voutsas | |
| 8,016,628 | B2 | 9/2011 | Lee et al. | |
| 2003/0038900 | A1* | 2/2003 | Song | G02F 1/136227 349/43 |
| 2008/0158493 | A1* | 7/2008 | Park | G02F 1/1339 349/139 |
| 2010/0097301 | A1* | 4/2010 | Sumiya | H01J 1/30 345/63 |
| 2012/0280969 | A1* | 11/2012 | Hough | G09G 3/3433 345/212 |

* cited by examiner

*Primary Examiner* — Trung Q Dang
(74) *Attorney, Agent, or Firm* — Law Office of Gerald Maliszewski; Gerald Maliszewski

(57) ABSTRACT

A method is provided for forming a circuit-on-wire (CoW) assembly. The method forms a flexible line with a plurality of periodic alignment marks used as a guide to place CoW devices overlying a surface of the flexible line. The CoW devices may be LEDs, capacitors, diodes, photodiodes, resistors, thin-film transistors, or combinations of the above-listed elements. The flexible line may be a conductive material, such as a metal wire, and the periodic alignment marks may be vias formed through the wire. If the flexible line is electrically conductive, an electrically conductive adhesive may be applied to the electrically conductive line, so that an electrical connection is formed between the CoW devices and the electrically conductive line. Subsequent to placing the CON devices, processes may be formed on the flexible line and CoW devices such as lithographic etching and thin-film deposition. An active matrix array using CoW devices is also presented.

12 Claims, 9 Drawing Sheets

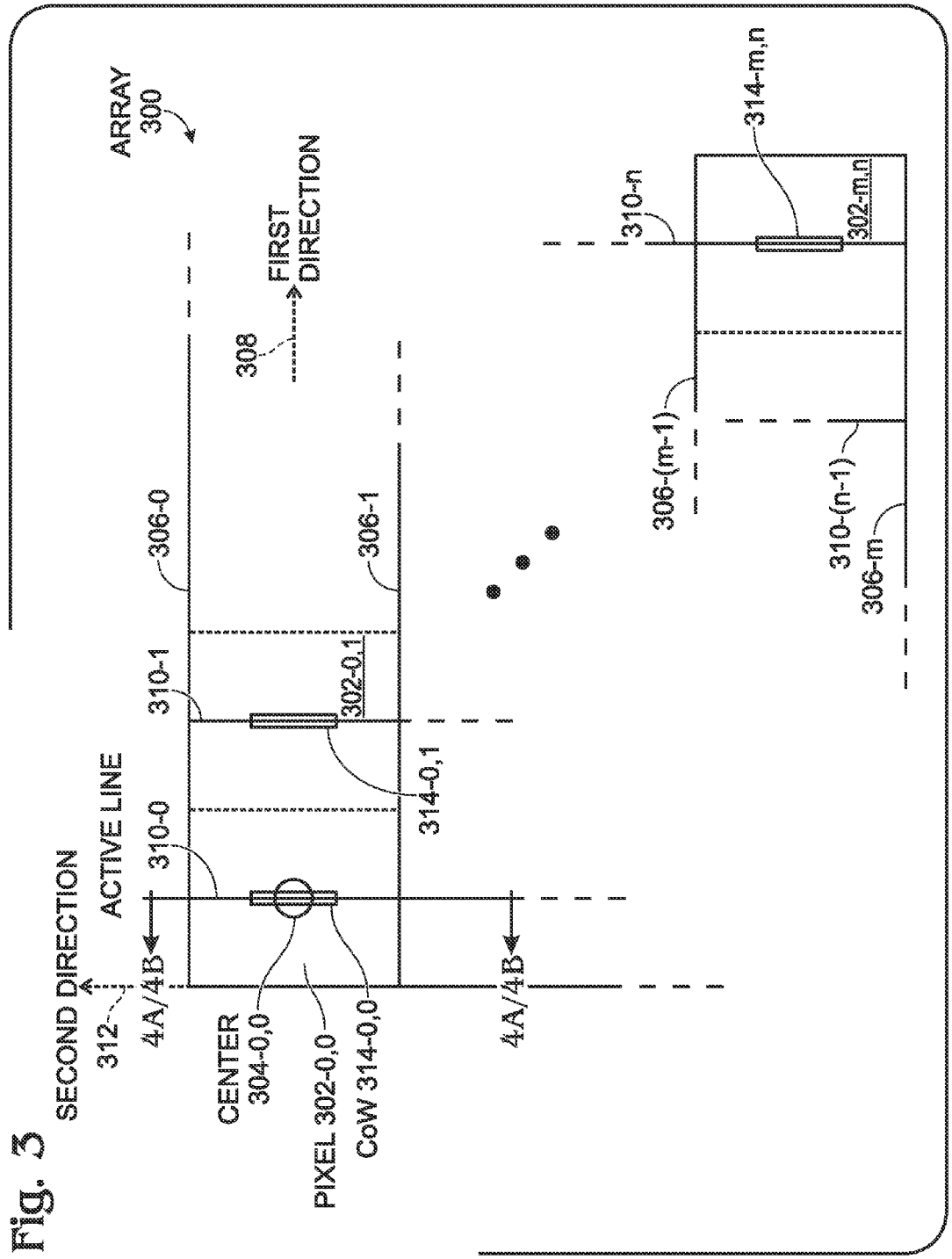

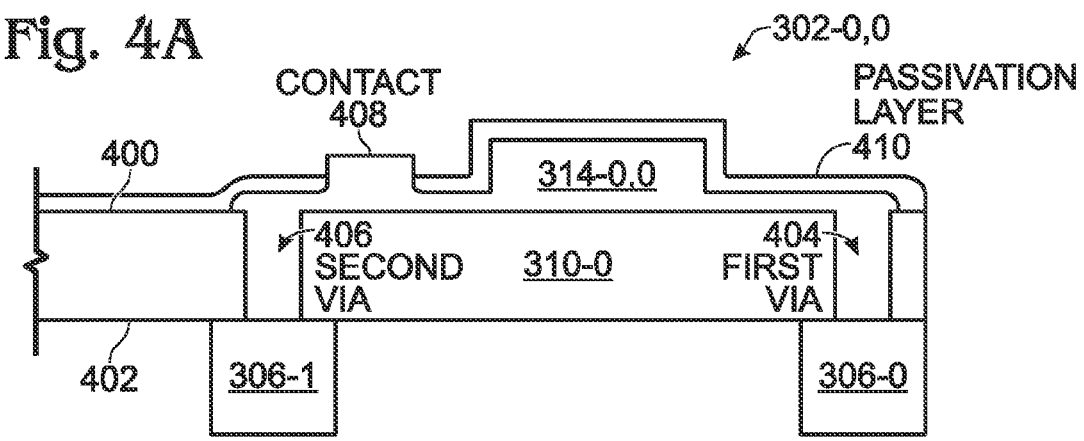
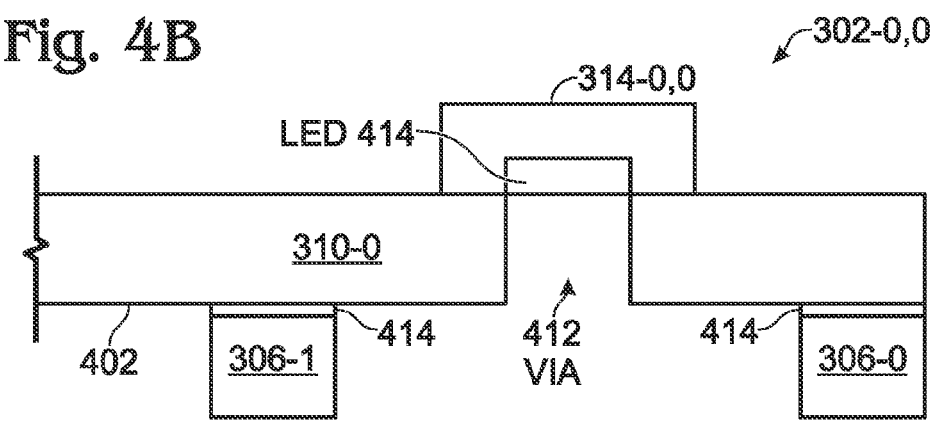
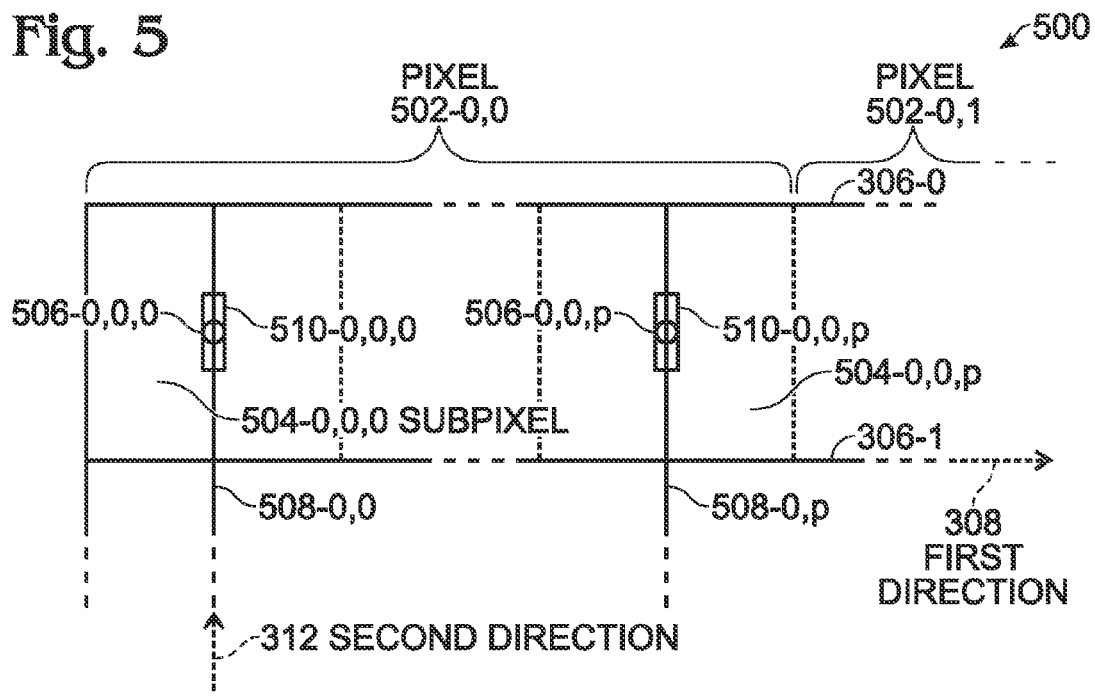

FABRICATION PROCESS USING CIRCUIT-ON-WIRE

RELATED APPLICATIONS

This application is a Continuation-in-Part of an application entitled, CIRCUIT-ON-WIRE, invented by Voutsas et al, Ser. No. 14/169,202, filed Jan. 31, 2014, which is incorporated herein by reference.

BACKGROUND OF THE INVENTION

1. Field of the Invention

This invention generally relates to display fabrication and, more particularly, to a circuit-on-wire (CoW) technology useful in the fabrication of large array electronic panels.

2. Description of the Related Art

The fabrication of backplane arrays for various types of flat panel displays, such as liquid crystal display (LCD) or organic light emitting diode (OLED), requires multiple deposition and photolithographic patterning (selective etching) steps. These steps must take place using specialized process equipment capable of handling the substantial size of the substrates typically used for display manufacturing. In that sense, the manufacturing cost is a function of the substrate area and, hence, tends to increase geometrically with the display size [i.e. manufacturing cost~(display diagonal)$^2$]. In order to achieve a lower product cost, manufacturing costs must be minimized. This fact is especially evident in the case of large displays, which have become increasingly ubiquitous in everyday life from home TVs, to information and advertising digital signs.

Another important issue in display backplane fabrication is optical transparency. High optical transparency is desirable for improving display appearance (i.e. brightness) and, ultimately, for enabling a visually transparent panel that can seamlessly integrate with its surroundings and function harmoniously within its operating environment.

FIG. 1 is a plan view of a thin-film transistor (TFT) active matrix array backplane (prior art). The backplane consists of a plurality of pixel elements formed by the intersecting horizontal (gate) and vertical (data) metal lines. These pixel elements host a number of sub-components (mostly thin film transistors and capacitor elements), which function to determine the "state" of the pixel in other words, how much light is allowed through the pixel area to reach an observer. For a highly transparent display, which one can "see through" when not displaying an image, it is desirable that the majority of the pixel area be void of any components that may obstruct the passage (transmission) of visible light. For example, referring to FIG. 1B, it is desirable to maximize the "active" area and minimize the "dead zone" area. Note: although a display backplane is depicted, the same issues apply to an active matrix array that receives and processes light, such as a charge-coupled device (CCD) camera.

FIG. 2 is a plan view of a typical LCD pixel structure (prior art). In terms of fabrication, pixels—consisting of the intersecting metal lines and the internal subcomponents—are constructed by a succession of thin-film material formation (e.g. deposition) steps and feature-patterning steps by subtractive processing (e.g. combination of photolithography and etching steps).

The pixel size is determined by the desired resolution of the panel, expressed in pixels-per-inch (PPI). For example, a 50 PPI panel consists of 508×508 micron (μm) pixels, while a 150 PPI panel consists of 169×169 μm pixels. For a full-color display, the pixel is further divided into sub-pixels in the simplest case one sub-pixel for each of (R)ed, (G)reen and (B)lue). As a result, the ultimate sub-pixel size is given (in μm) by the formula: 25400/(3·PPI), where PPI refers to the target panel resolution. State of the art displays use four colors, with an additional (Y)ellow sub-pixel. In the ideal case, all the pixel area contributes to light transmission, but practically, only a portion of the pixel area actually transmits light. As shown in FIG. 2 for example, light transmission is blocked by the capacitor(s), TFT(s), and width of metal wires (horizontal & vertical). The area of these components tends to scale with the overall pixel area. For very small pixels, the effective pixel area (expressed often by the term aperture ratio) tends to become prohibitively small. For a high quality transparent display, aperture ratios (the ratio of transmissive area to total pixel area) of more than 85% are typically demanded.

The majority of LED displays are based on organic LEDs (OLEDs), a technology that is plagued by issues with product lifetime due to blue efficiency, sensitivity to humidity, and oxygen, in addition to high manufacturing costs. Inorganic LEDs can resolve issues of lifetime and environmental sensitivity, but they are difficult to scale to large substrate sizes.

It would be advantageous if a means existed that allowed for the implementation of high quality inorganic LED displays, with a manufacturing cost similar to the current industry standard (e.g. LCDs).

It would be advantageous if a means existed for fabricating an active matrix array with a larger aperture ratio

SUMMARY OF THE INVENTION

Disclosed herein is a method that provides a path to low cost display panels based on inorganic light emitting diodes (LEDs). One feature of the method is the integration of LED devices on the surface of thin metal wires that can then be "weaved" together to construct a pixelated pattern on a provided substrate. The pixelated pattern can be any pattern that allows for the formation of light controlling elements ("pixels"), whereby the light emission from, or light reception by, such pixels work in cooperation with electronics signals (e.g. current, or voltage) passed through the weaved thin metal wires. For example, the pixelated pattern can consist of a first set of electrical signal carrying thin metal wires and a second set of electrical signal carrying thin metal wires, orthogonal to each other, where the pixels are then defined by the intersecting two sets of thin metal wires.

Accordingly, a method is provided for forming a circuit-on-wire (CoW) assembly. The method forms a flexible line with a plurality of periodic alignment marks, and using the periodic alignment marks as a guide, places CoW devices overlying surface of the flexible line. The CoW devices may be LEDs, capacitors, diodes, photodiodes, resistors, thin-film transistors (TFTs), or combinations of the above-listed elements. For example, the flexible line may be a conductive material, such as a metal wire, and the periodic alignment marks may be vias formed through the wire. In one aspect, an adhesive is applied to the flexible line prior to placing the CoW devices. If the flexible line is electrically conductive, an electrically conductive adhesive may be applied to the electrically conductive line, so that an electrical connection is formed between the CoW devices and the electrically conductive line.

Subsequent to placing the CoW devices, processes may be performed on the flexible line and CoW devices such as lithographic etching and thin-film deposition. As a result of the method, an assembly of discrete CoW devices is formed periodically aligned in sequence along the flexible line. The assembly may subsequently be spooled for storage.

Additional details of the above-described method and an active matrix array using CoW devices are presented below.

BRIEF DESCRIPTION OF THE DRAWINGS

FIG. 3 is a plan view of an active matrix array.

FIGS. 4A and 4B are partial cross-sectional views of a pixel.

FIG. 5 is a plan view variation of the array of FIG. 3, depicting one exemplary pixel with a plurality of subpixels.

FIG. 12A is a plan view of a connected µLED chiplet in an array configuration, while

DETAILED DESCRIPTION

Figure 1:
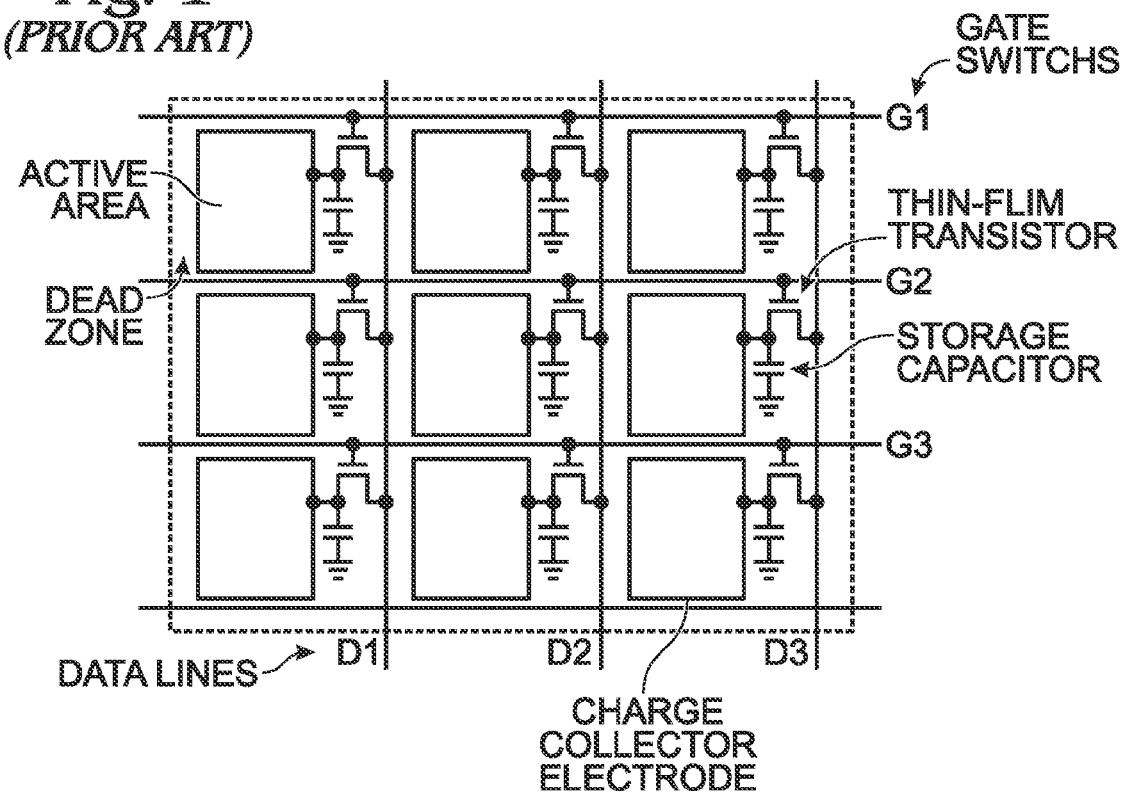
FIG. 1 is a plan view of a thin-film transistor (TFT) active matrix array backplane (prior art).
Figure 2:
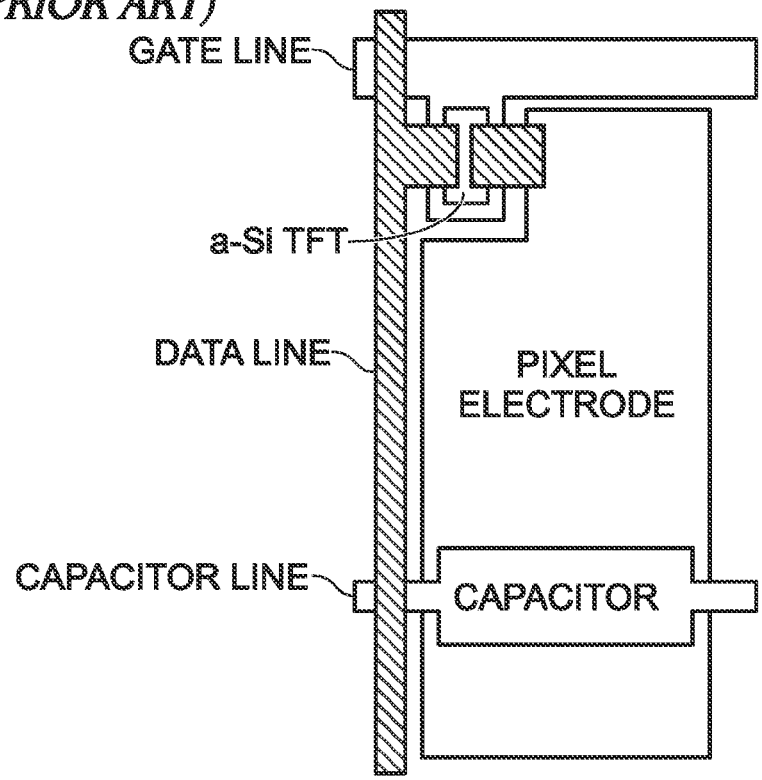
FIG. 2 is a plan view of a typical LCD pixel structure (prior art).

FIG. 3 is a plan view of an active matrix array. The array 300 comprises a plurality of pixels 302-0,0 through 302-$m,n$, where m and n are integers greater than one. Using pixel 302-0,0 as an example, each pixel has a center 304-0,0 and further comprises a first conductive line 306-0 and a parallel second conductive line 306-1 aligned in a first direction 308. An active line 310-0 is aligned in a second direction 312 orthogonal to the first direction 308 and mechanically connected to the first conductive line 306-0 and second conductive line 306-1. The active line 310-0 bisects the center 304-0,0 of pixel 302-0,0. For example, the active line may be relatively flat or oval in its cross-section (not shown).

A circuit-on-wire (CON) device 314-0,0 overlies an outer surface of the active line 310-0 and is electrically connected to the first conductive line 306-0, second conductive line 306-1, or both the first and second conductive lines. Here, the CoW device is represented as a rectangular box having a width greater than the active line. However, the actual CoW devices are typically narrower than the active lines on which they are formed. For example, the first conductive line 306-0 may be a data or gate line, as they are termed by those familiar with array fabrication. If the first conductive line 306-0 is a data line, the active line 310-0 may be a gate line and the second conductive 306-1 a power line. Alternatively, if the first conductive line 306-0 is a gate line, the active line 310-0 may be a data line and the second conductive 306-1 a power line. Alternatively, the first conductive line 306-0 may be a power line and the second conductive line may be either a data or gate line. In one aspect, the active lines (i.e. active line 310-0) are electrically conductive and the CoW devices (i.e. device 314-0,0) are electrically connected to the active lines. Alternatively, some or all of the CoW devices may be electrically isolated from the active lines.

The CoW device 310-0,0 may comprise a light emitting diode (LED), a capacitor, a diode, a photodiode, a resistor, a thin-film transistor (TFT), a plurality of TFTs, or a combination of the above-listed elements. For example, a typical light emitting CoW device may comprise a TFT, storage capacitor, and LED. In another example, the light emitting CoW device may comprise a drive TFT, switch TFT, capacitor, and LED. As another example, the CoW device 310-0,0 may be a TFT with a gate electrode accessible through the (conductive) active line. Further, the CoW device 310-0,0 may comprise a photodiode such as might be used in a charge-coupled device (CCD) array. It should be understood that the CoW devices of adjacent pixels may be the same or different types of devices.

FIGS. 4A and 4B are partial cross-sectional views of a pixel. In FIG. 4A, using pixel 302-0,0 as an example, the active line 310-0 comprises an outer top surface 400, an outer bottom surface 402, a first via 404 for mechanically connecting the active line to the first conductive line 306-0, and a second via 406 for mechanically connecting the active line to the second conductive line 306-1. The CoW device 314-0,0 may be electrically connected to the first conductive line 306-0 through the first via 404, electrically connected to the second conductive line 306-1 through the second via 406, or electrically connected to both the first and second conductive lines as shown. In another aspect as shown, the active line 310-0 has an accessible electrical contact 408 electrically connected to the CoW device 314-0,0. However, contact 408 is optional and need not be electrically connected to the CoW device, first via, or second via. In one aspect as shown, a passivation layer 410 overlies the active line 310-0,0 and CoW device 314-0,0. Although not shown, the passivation layer may also be formed underlying the active line. The passivation layer may come preformed on the active line, or it may be deposited after the active line is fabricated with the first and second conductive lines. Again, the passivation layer 610 is optional. Further, if present, the passivation layer may be selectively etched. As shown, the passivation layer 410 has been selectively etched to expose contact 408. In one aspect, the etching is performed during CoW fabrication, prior to the fabrication of the array. Alternatively, the etching may be performed as the CoW is integrated into a higher assembly at the array level.

In FIG. 4B, active line 310-0 comprises the outer bottom surface 402 and a via 412. In this case, the CoW device 314-0,0 comprises an LED 414 formed on the active line outer bottom surface 402 and exposed by the via 412. Also as shown, the active line 310-0 may be mechanically connected to the first conductive line 306-0 and second conductive line 306-1 using an adhesive 414, which may or may not be electrically conductive.

FIG. 5 is a plan view variation of the array of FIG. 3, depicting one exemplary pixel with a plurality of subpixels. In this array 500, each pixel (i.e. pixel 502-0,0) comprises a plurality of subpixels 504-0,0,0 through 504-0,0,$p$, where p is an integer greater than zero. Each subpixel 504-0,0,0 through 504-0,0,$p$ has a center, respectively 506-0,0,0 through 506-0,0,$p$, and further comprises an active line, respectively 508-0,0 through 508-0,$p$, aligned in the second direction 312. Each active line bisects the center of a corresponding subpixel. Further, each active line is mechanically connected to the first conductive line 306-0 and second conductive line 306-1. A CoW device, respectively 510-0,0,0 through 510-0,0,*p*, overlies the outer surface of each corresponding active line and is electrically connected to at least one of the first and second conductive lines 306-0 and 306-1.

As described above, LED devices can be integrated onto the surface of thin metal wires, which can be then "weaved" together to construct a pixelated pattern on a provided substrate. The pixelated pattern can be any pattern that allows for the formation of light controlling elements (pixels), whereby the light emission from, or light reception by, such pixels work in cooperation with electronics signals (e.g. current, or voltage) passed through the weaved thin metal wires. For example, the pixelated pattern can consist of a first set of electrical signal carrying thin metal wires and a second set of electrical signal carrying thin metal wires, orthogonal to each other. Pixels are then defined by the intersecting two sets of thin metal wires.

Figure 6:
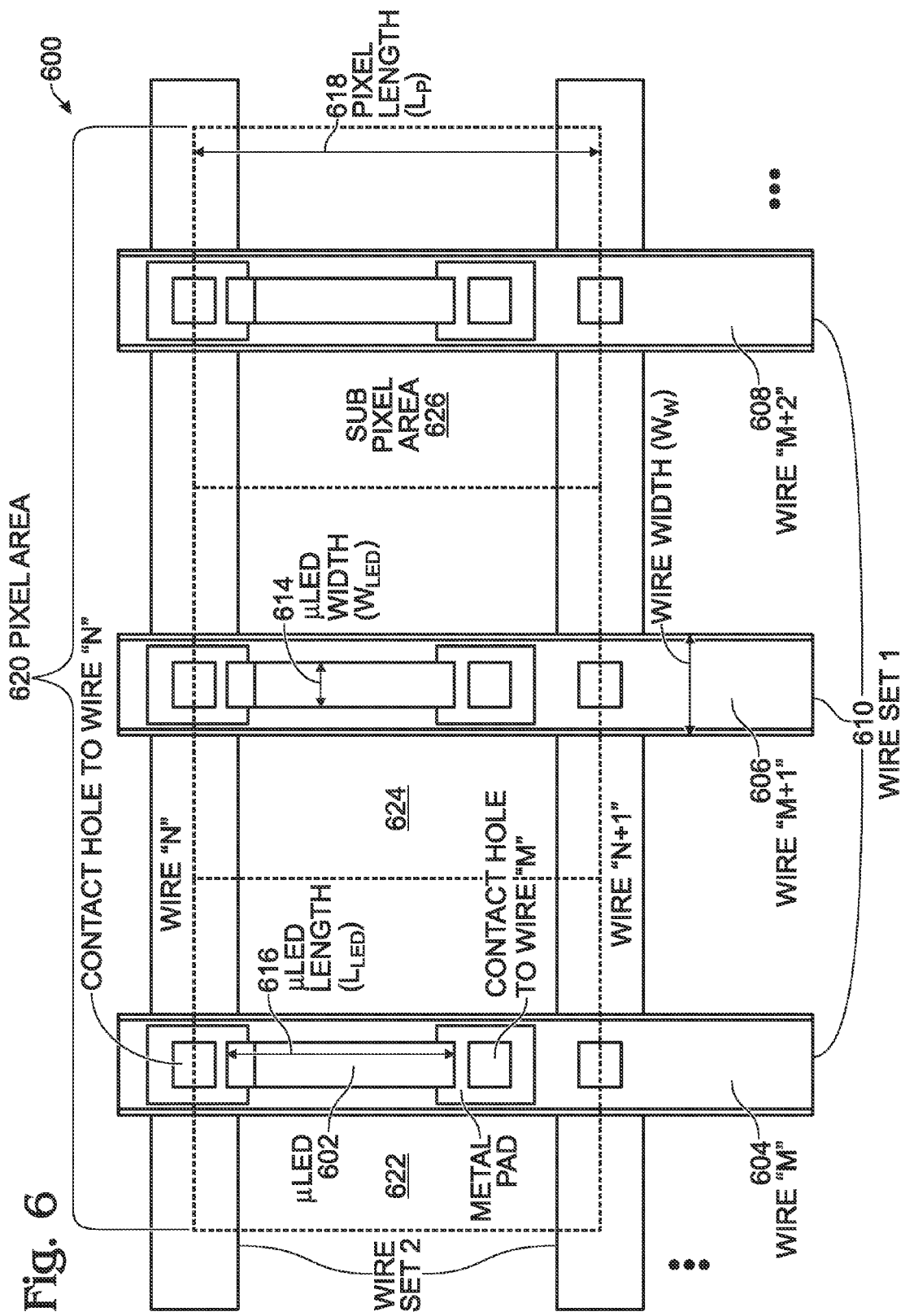
FIG. 6 is a plan view showing the array of FIG. 3 in greater detail.

FIG. 6 is a plan view showing the array of FIG. 3 in greater detail. Illustrated is a portion of a pixelated array 600 (in this case it is a passive matrix array), featuring LEDs 602 on top of thin metal wires (active lines M 604, (M+1) 606, and (M+2) 608), forming wire set 1 (610). The LEDs 602 are micro-LEDs (μLEDs) and are made off-line by methods and processes that would be known in the art. One important aspect of these LED devices 602 is that they are of dimensions suitable to place on top of a metal wire with width 612 in the range of 40-200 microns (μm). Then, one dimension of the μLED (e.g. width 614) is determined by the width of the thin metal wire. The other dimension of the μLED (e.g. length 616) is determined, to a first extent, by the fabrication method of the μLED, and, to a second extent, by the pixel dimension. Typically, pixel dimensions (pixel length and width) are the same in the range of 50 μm-850 μm. For full color displays, however, the width of each pixel 620 is further subdivided to three parts (in the simplest case), representing (R)ed, (G)reen, and (B)lue subpixels, respectively 622, 624, and 626. The length of each subpixel is the same as the length of the original pixel ($L_P$) 618.

Figure 7A:
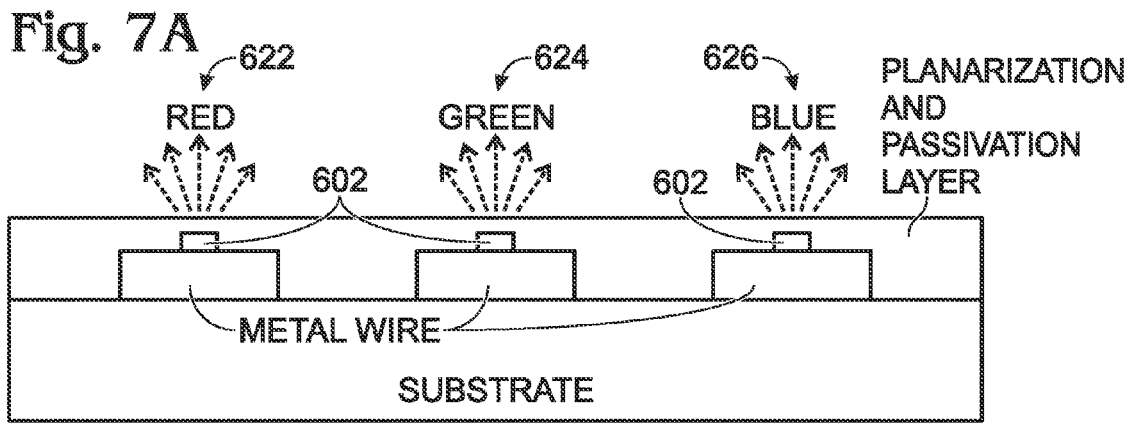
FIGS. 7A and 7B are partial cross-sectional views depicting alternative methods of implementing full color LED displays.
Figure 7B:
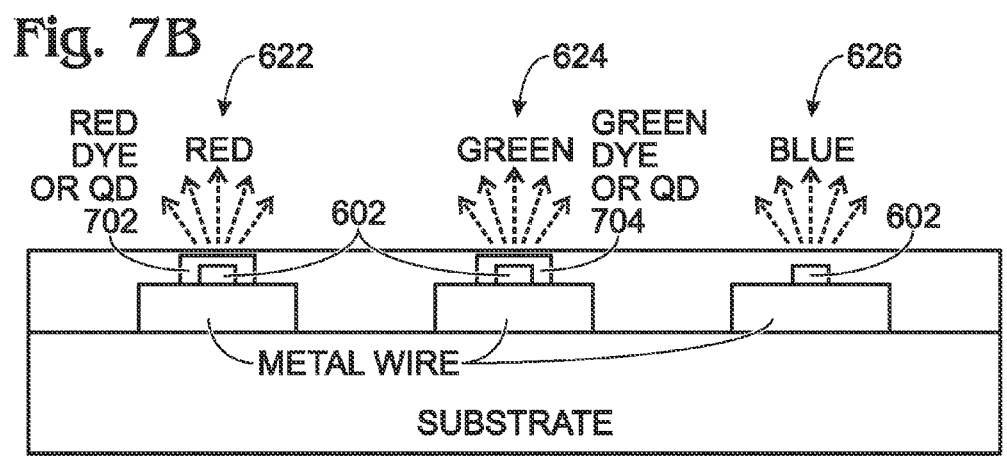

FIGS. 7A and 7B are partial cross-sectional views depicting alternative methods of implementing full color LED displays. As shown in FIG. 7A, each subpixel is enabled with a μLED 602 of the appropriate color (R, or G, or B). Another possibility, as shown in FIG. 7B, is to have all subpixels formed from a blue-emitting μLED 602 and then add a layer of color conversion elements, respectively 700 and 702, to yield (R)ed and (G)reen emitters. It is possible that for larger pixels, multiple μLED segments (per subpixel) are integrated on the thin metal wire (connected in parallel), whereas for smaller pixels, one μLED segment (per subpixel) is sufficient.

Figure 8A:
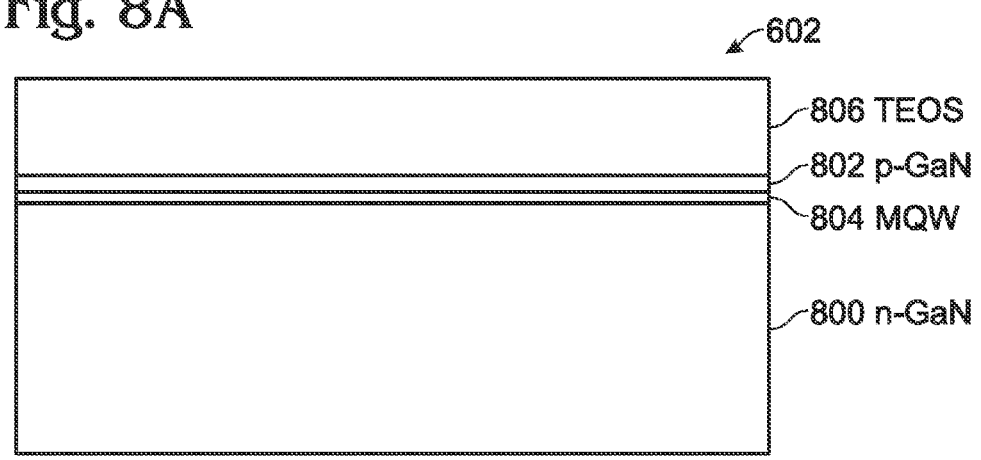
FIGS. 8A and 8B are partial cross-sectional views of a blue-emitting gallium nitride (GaN) µLED (prior art).
Figure 8B:
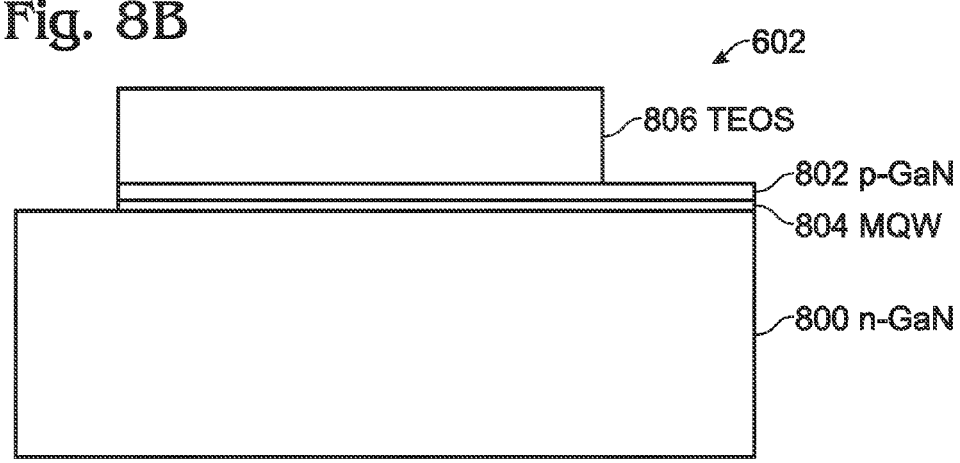

FIGS. 8A and 8B are partial cross-sectional views of a blue-emitting gallium nitride (GaN) μLED (prior art). The structure of the μLED 602 consists of a top and a bottom contact typically a n-type layer 800 and a p-type layer 802 sandwiching a multiple-quantum-well (MQW) structure 804 that is responsible for the emission of light with a wavelength that depends on the relative thickness of the MQW structure and material selection, for example, a blue-emitting GaN μLED. It should be understood that the μLEDs 602 are fabricated separately ("off-line") and subsequently are attached to the thin metal wires or active lines. The final μLED device may be subjected to additional "off-line" fabrication steps that prep the μLED device for integration with the thin metal wire. For example, FIG. 8B illustrates the same device as FIG. 8A after additional tetraethyl-orthosilicate (TEOS) 806 etching steps that expose the p-GaN 800 and the n-GaN 802 layers so that metal-appropriate contacts can be formed to allow electrical operation of the device.

Once the μLED device chiplet has been prepared it is then attached to the thin metal wire. The attachment process can be accomplished by a "pick-and-place" method using a process that allows precise placement of μLED chiplets on the metal wire with a specified spacing. This process is automated and, in one aspect, involves a thin metal wire fed from a spool, unspooling at a stepwise fashion with a specified speed that permits the simultaneous placement of one or more μLED chiplets at specific regions of the unspooled wire segment. After the placement of the μLED chiplets, the thin metal wire is re-spooled, resulting in a spool consisting of a thin metal wire with attached μLED chiplets. The wire is subsequently used to weave the display matrix.

Figure 9:
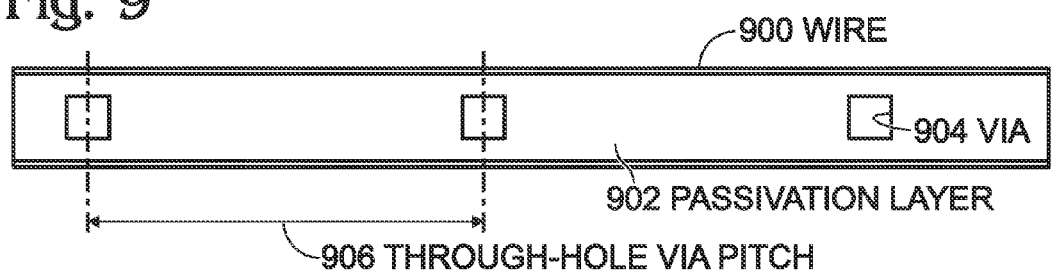
FIG. 9 illustrates features of a processed thin metal wire.

FIG. 9 illustrates features of a processed thin metal wire. Prior to the integration process, the thin metal wire 900 likely undergoes a few processing steps itself. Examples include the formation of a passivation layer 902 on the metal wire's surface and the formation of thru-hole vias 904. Such processing can be performed on the as-received thin metal wire, or they be integrated with the wire manufacturing process. Roll-to-roll processing enables low-cost modifications and enhancements to the thin metal wire. The thru-hole vias 904 are etched at a specified pitch 906. The pitch 906 can be in the range of 50-1000 μm. The thru-hole vias 904 may serve as a means to establish an electrical connection to other parts of the final array (e.g. crossing wires).

Figure 10:
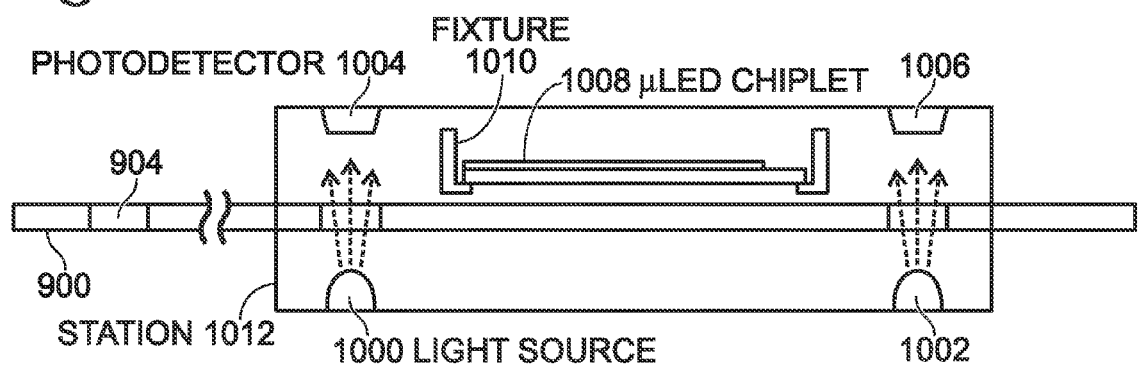
FIG. 10 illustrates of a method for aligning and placing µLED chiplets on a thin metal wire.

FIG. 10 illustrates of a method for aligning and placing μLED chiplets on a thin metal wire. In addition to enabling electrical and mechanical connections, the same vias 904 may be used to align the unspooled wire segment during the μLED placement step. For example, using two illumination sources 1000 and 1002, and two photodetectors 1004 and 1006 at the same pitch, the thru-holes 904 can establish an optical detection scheme that allows a wire segment to be appropriately aligned prior to receiving the μLED chiplet 1008 carried by fixture 1010. Alternatively, the metal wire lengths may be precisely measured, marked, or the passivation selectively etched at a periodic pitch as a means of alignment.

Hence, the μLED alignment and placement station (denoted by the black framed box 1012) can be customized to accommodate a range of thru-holes via pitch and μLED length by simple adjustments to the light source/photodetector pitch and μLED carrying fixture. Additional thru-holes may be added to the thin metal wire to facilitate optical inspection of the array (e.g. to point out pixels where μLEDs are not properly aligned or even missing), or to assist in the weaving process (e.g. ensure that thin metal wires are placed level on the substrate). Such thru-holes may be of different dimensions than the thru-hole vias used to make electrical or mechanical connections between wires.

Prior to placing the μLED chip 1008 on the thin metal wire 900, an optional adhesive may be applied (not shown), for example using an ink-jet nozzle, to improve the bonding between the μLD chiplet and the metal wire carrier. The adhesive may be also exploited to improve heat conduction between the μLED and the underlying metal heat sink. It is noted that one of the key issues with the use of LEDs on insulating surfaces is the effective removal of generated heat. In that sense, the integration of μLEDs on top of thin metal wires has the added advantage of providing an adequate heat sink (the metal wire) that can maintain the μLED temperature within acceptable range for robust performance and long life.

Figure 11A:
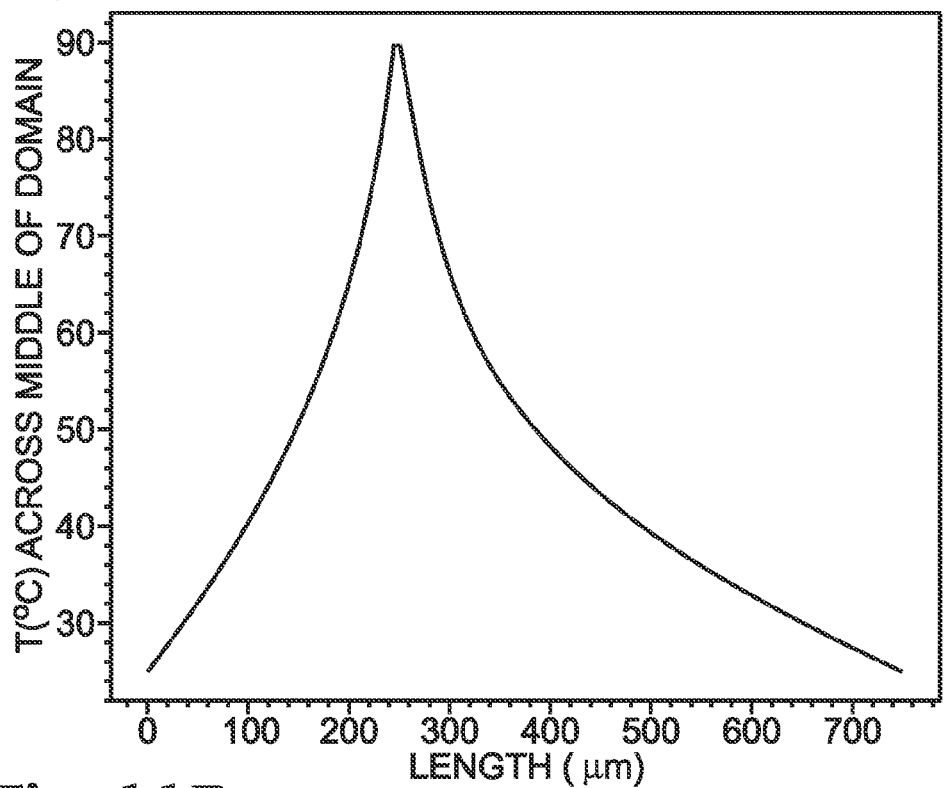
FIGS. 11A and 11B are graph simulations of the steady-state temperature within a pixel domain that contains a µLED embedded between two cover sheets of glass (bottom glass plate thickness of 500 µm and top glass plate thickness of 250 µm).
Figure 11B:
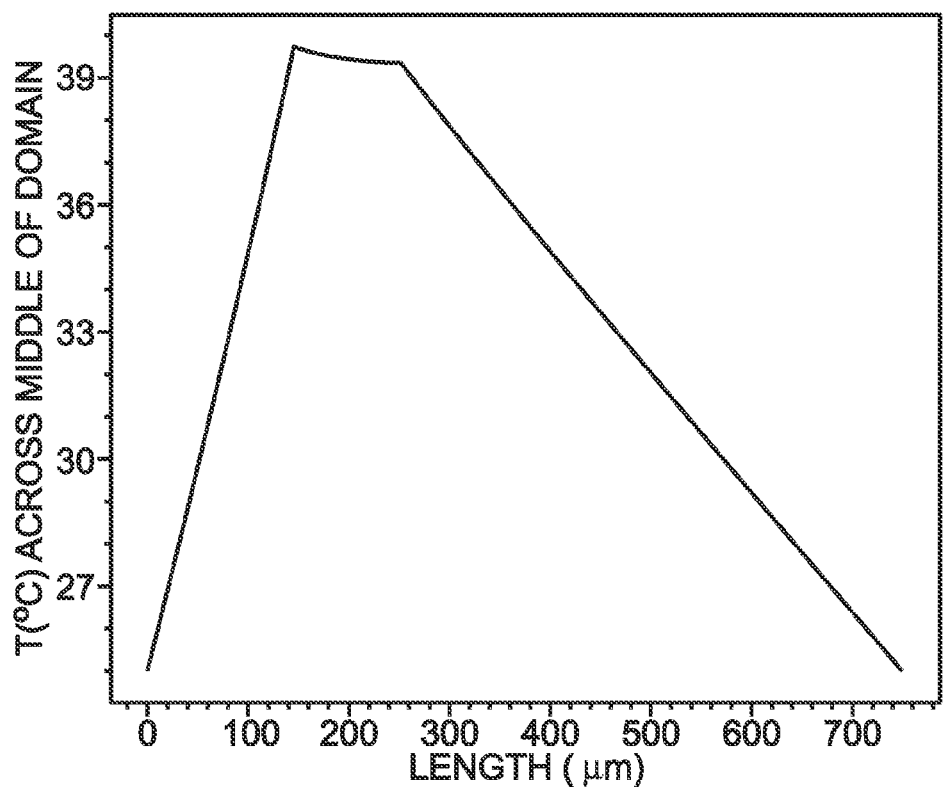

FIGS. 11A and 11B are graph simulations of the steady-state temperature within a pixel domain that contains a μLED embedded between two cover sheets of glass (bottom glass plate thickness of 500 μm and top glass plate thickness of 250 μm). The pixel size is 1 mm, the μLED size is 5 μm (thick) by 50 µm (long) and it is centered within the pixel domain. The peak temperature in each panel corresponds to the location of the µLED. FIG. 11A shows the case of no heat sink under the µLED. In this case, the temperature of the µLED rises to about 90° C., which is unacceptably high for sustainable operation. FIG. 11B depicts the case where the µLED is placed on top of a thin metal foil with thickness of 100 µm that runs the whole length of the pixel. In this case, the µLED temperature is found to not exceed 40° C., which is a level compatible with robust operation. It is noted that the temperature of the µLED remains lower than 50° C. (a level that is deemed acceptable for sustained operation), when the thickness of the thin metal foil is further reduced to 50 µm ($T_{LED}$=43° C.), and down to 10 µm ($T_{LED}$=49° C.).

It is further noted that after the µLED is placed on the thin metal foil, additional processing steps may be needed to make electrical connections. These steps can be carried out using conventional lithography on the spooled thin metal wire, for example, in a roll-to-roll processing environment. Once the µLED-bearing thin metal wire is fully processed, it is then applied (weaved) to the substrate along with the non-µLED-bearing thin film wire to form the display panel. During that time, additional steps involving application of conductive adhesives at wire cross-overs may be used to ensure adequate mechanical and/or electrical contact between the two orthogonal sets of thin metal wires.

Figure 12A:
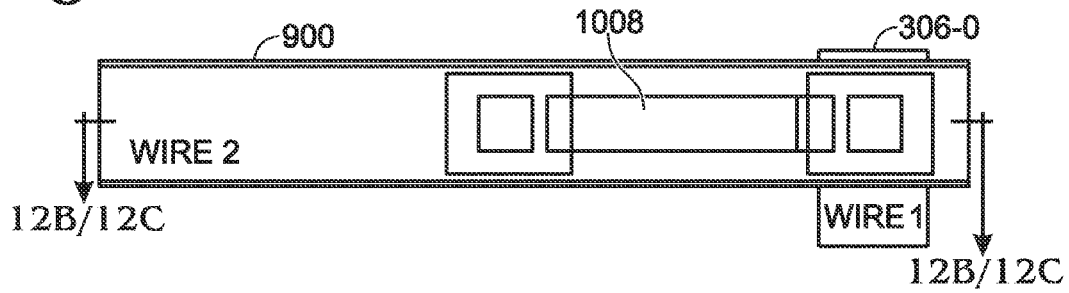
Figure 12B:
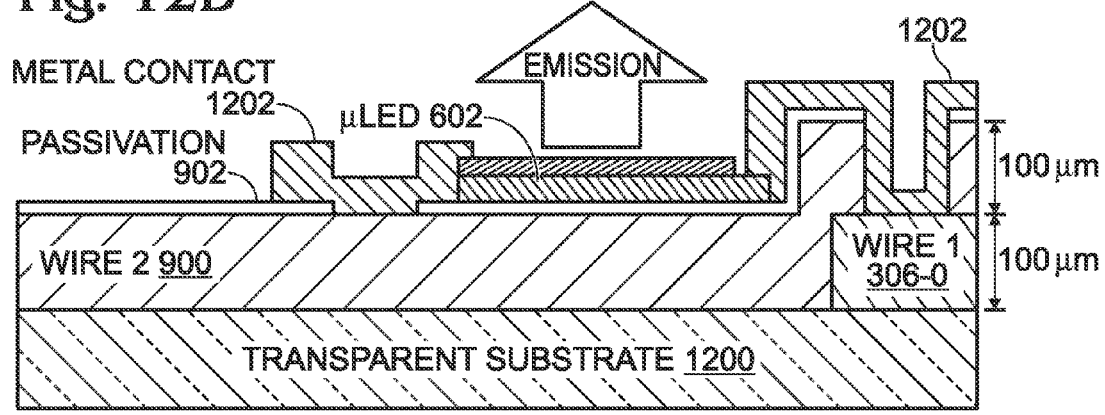
FIGS. 12B and 12C are cross-sectional views of two different aspects of the connected µLED.
Figure 12C:
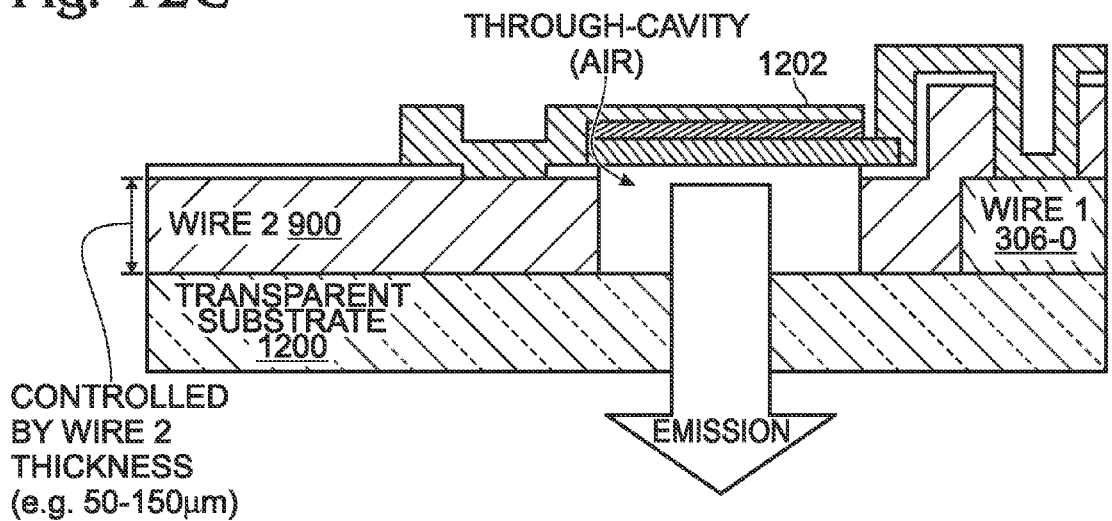

FIG. 12A is a plan view of a connected µLED chiplet in an array configuration, while FIGS. 12B and 12C are cross-sectional views of two different aspects of the connected µLED. In FIG. 12B, the light emission from the µLED is directed upwards (reflected by the underlying metal wire 900). In FIG. 12C, the light emission from the µLED is directed downwards (towards the transparent substrate). In that case, light emission in the other direction (up) is reflected by the back metal contact 1202.

Figure 13:
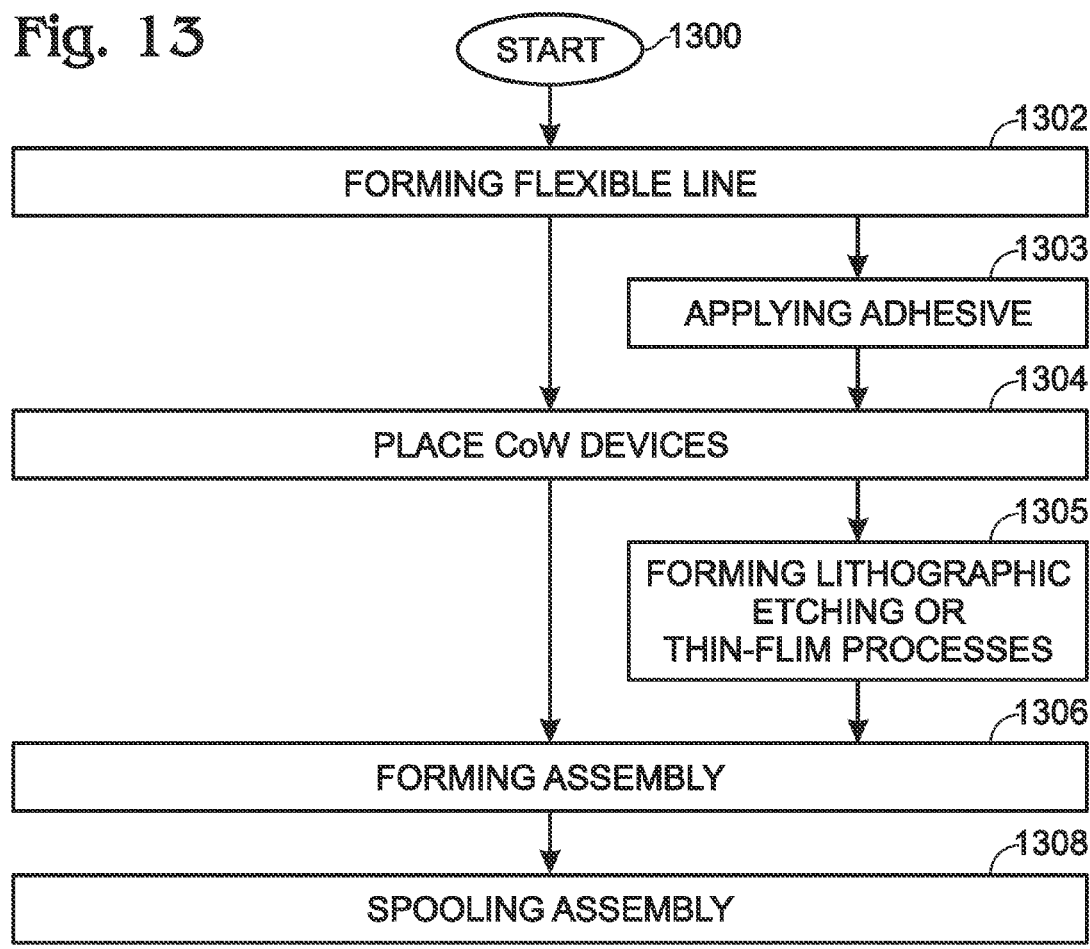
FIG. 13 is a flowchart illustrating a method for forming a circuit-on-wire (CoW) assembly.

FIG. 13 is a flowchart illustrating a method for forming a circuit-on-wire (CoW) assembly. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1300.

Step 1302 forms a flexible line with a plurality of periodic alignment marks, and Step 1304 uses the periodic alignment marks as a guide to place CoW devices overlying a surface of the flexible line. The CoW devices may comprise an LED, capacitor, diode, photodiode, resistor, TFT, a plurality of TFTs, or a combination of the above-listed elements. As described above, the periodic alignment marks may be vias, optically detectable marks, or selectively etched regions. The flexible line formed in Step 1302 may an electrically conductive line, such as a metal wire. Subsequent to placing the CoW devices, Step 1306 forms an assembly of discrete CoW devices periodically aligned in sequence along the flexible line. Step 1308 may spool the assembly (roll-to-roll) for storage.

In one aspect, prior to placing the CoW devices in Step 1304, Step 1303 applies an adhesive to the flexible line. In another aspect, where the flexible line is electrically conductive, Step 1303 may apply an electrically conductive adhesive to the electrically conductive line, so that in Step 1304 the placement of the CoW devices results in an electrical connection between the CoW devices and the electrically conductive line. In another aspect, prior to Step 1303, the conductive flexible line may be selectively etched to remove a passivation layer where the CoW devices are to be placed.

In one aspect, subsequent to placing the CoW devices in Step 1304, Step 1305 performs a process such as lithographic etching, thin-film deposition, or a combination of these processes. In this manner the CoW devices can be modified or processed after placement, or additional components formed to operate in cooperation with the placed CoW devices. In another aspect, Step 1302 forms a flexible line with a plurality of vias, and Step 1304 places CoW devices comprising an underlying light emitting diode (LED) exposed by the vias (see FIGS. 4B and 12C).

A method for forming a CoW assembly, and an array fabricated using a CoW assembly, have been provided. Examples of particular devices, interconnections, pixel types, and process steps have been presented to illustrate the invention. However, the invention is not limited to merely these examples. Other variations and embodiments of the invention will occur to those skilled in the art.

I claim:

1. An active matrix array comprising:
   a plurality of pixels, each pixel having a center and comprising:
   a first conductive line and a parallel second conductive line aligned in a first direction;
   an active line aligned in a second direction orthogonal to the first direction and mechanically connected to the first and second conductive lines, with a circuit-on-wire (CoW) device overlying an outer surface of the active line electrically connected to at least one of the first and second conductive lines; and,
   wherein the active line bisects the center of the pixel.

2. The array of claim 1 wherein the CoW device is electrically connected to both the first and second conductive lines.

3. The array of claim 1 wherein the active line comprises an outer top surface, an outer bottom surface, a first via between the outer top and bottom surfaces for mechanically connecting the active line to the first conductive line, and a second via between the outer top and bottom surfaces for mechanically connecting the active line to the second conductive line.

4. The array of claim 1 wherein the active line comprises an outer top surface, an outer bottom surface, and a first via between the outer top and bottom surfaces; and,
   wherein the CoW device is electrically connected to the first conductive line through the first via.

5. The array of claim 4 wherein the active line comprises a second via between the outer top and bottom surfaces; and,
   wherein the CoW device is electrically connected to the second conductive line through the second via.

6. The array of claim 1 wherein the active line comprises a top surface with an accessible electrical contact electrically connected to the CoW device.

7. The array of claim 1 wherein the CoW device comprises an element is selected from a group consisting of a light emitting diode (LED), a capacitor, a diode, a photodiode, a resistor, a thin-film transistor (Tyr), a plurality of WI's, and a combination of the above-listed elements.

8. The array of claim 1 further comprising:
   a passivation layer overlying the active line and CoW device.

9. The array of claim 1 wherein each pixel comprises a plurality of subpixels, each sub pixel having a center and comprising:
   an active line aligned in the second direction and mechanically connected to the first and second conductive lines, with a CoW device overlying an outer surface of the active line electrically connected to at least one of the first and second conductive lines; and, wherein each active line bisects the center of a corresponding subpixel.

10. The array of claim 1 wherein the first conductive line is selected from a first group consisting of data and gate lines;

wherein the active line is unselected from the first group; and, wherein the second conductive line is a power line.

11. The array of claim 1 wherein the active line is electrically conductive; and, wherein the CoW device is electrically connected to the active line.

12. The array of claim 1 wherein the active line comprises an outer bottom surface and a via; and, wherein each CoW device comprises an LED formed on the active line outer bottom surface and exposed by the via.

* * * * *

UNITED STATES PATENT AND TRADEMARK OFFICE
CERTIFICATE OF CORRECTION

| | | |
|---|---|---|
| PATENT NO. | : 9,299,725 B2 | Page 1 of 1 |
| APPLICATION NO. | : 14/256093 | |
| DATED | : March 29, 2016 | |
| INVENTOR(S) | : Apostolos Voutsas | |

It is certified that error appears in the above-identified patent and that said Letters Patent is hereby corrected as shown below:

In the Claims

In column 8, at line 57, claim 7, the term "TFT" has been incorrectly printed as --Tyr--, and the term "TFTs" has been incorrectly printed as --WI's--. The claim should be printed as follows:

7. The array of claim 1 wherein the CoW device comprises an element is selected from a group consisting of a light emitting diode (LED), a capacitor, a diode, a photodiode, a resistor, a thin-film transistor (TFT), a plurality of TFTs, and a combination of the above-listed elements.

In column 8, line 63, claim 9, the term "subpixel" has been incorrectly printed as --sub pixel--.

Signed and Sealed this
Seventh Day of June, 2016

Michelle K. Lee
*Director of the United States Patent and Trademark Office*